United States Patent
Heck et al.

(10) Patent No.: US 7,183,622 B2
(45) Date of Patent: Feb. 27, 2007

(54) MODULE INTEGRATING MEMS AND PASSIVE COMPONENTS

(75) Inventors: John Heck, Berkeley, CA (US); Qing Ma, San Jose, CA (US); Eyal Bar-Sadeh, Jerusalem (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/882,635

(22) Filed: Jun. 30, 2004

(65) Prior Publication Data

US 2006/0001123 A1    Jan. 5, 2006

(51) Int. Cl.
*H01L 29/00* (2006.01)

(52) U.S. Cl. ............... 257/528; 438/106; 977/701; 977/724

(58) Field of Classification Search ........... 977/701, 977/724

See application file for complete search history.

(56) References Cited

U.S. PATENT DOCUMENTS

| | | | |
|---|---|---|---|
| 5,668,033 A | 9/1997 | Ohara et al. | |
| 6,025,767 A | 2/2000 | Kellam et al. | |
| 6,114,794 A | 9/2000 | Dhuler et al. | |
| 6,307,169 B1 | 10/2001 | Sun et al. | |
| 6,392,144 B1 | 5/2002 | Filter et al. | |
| 6,436,853 B2 | 8/2002 | Lin et al. | |
| 6,479,921 B2 | 11/2002 | Ma et al. | |
| 6,529,093 B2 | 3/2003 | Ma | |
| 6,531,668 B1 | 3/2003 | Ma | |
| 6,566,170 B1 | 5/2003 | Marion et al. | |
| 6,573,822 B2 | 6/2003 | Ma et al. | |
| 6,621,137 B1 | 9/2003 | Ma et al. | |
| 6,673,697 B2 | 1/2004 | Ma et al. | |
| 6,673,698 B1 | 1/2004 | Lin et al. | |
| 6,686,820 B1 | 2/2004 | Ma et al. | |
| 6,713,314 B2 * | 3/2004 | Wong et al. | 438/25 |
| 6,852,926 B2 * | 2/2005 | Ma et al. | 174/52.2 |
| 2003/0119219 A1 | 6/2003 | Farcy et al. | |
| 2004/0118599 A1 | 6/2004 | Chason et al. | |
| 2004/0140475 A1 | 7/2004 | Sun et al. | |
| 2006/0099742 A1 * | 5/2006 | Hochstenbach et al. | 438/127 |

OTHER PUBLICATIONS

Dual Action RF-MEMS Switch Suits System-on-Chip Integration, STMicroelectronics, Geneva, Jul. 21, 2003. Retrieved online on May 17, 2004. Retrieved from the internet: www.st.com/stonline/press/news/year2003/1310h.htm. pp. 1-2.

(Continued)

*Primary Examiner*—Douglas W. Owens
(74) *Attorney, Agent, or Firm*—Blakely, Sokoloff, Taylor & Zafman LLP (57) ABSTRACT

An apparatus may include a first substrate, one or more microelectromechanical systems (MEMS) coupled to the first substrate, a second substrate coupled with the first substrate, and one or more passive components coupled to the second substrate. A method may include aligning a first substrate having one or more MEMS coupled thereto and a second substrate having one or more passive components coupled thereto, and coupling the aligned substrates.

33 Claims, 8 Drawing Sheets

OTHER PUBLICATIONS

R. Tuominen, et al., "A Novel IMB Technology for Integrating Active and Passive Components". (C) 2000 IEEE. pp. 269-273.

Kyle Lebouitz, et al., "Vacuum Encapsulation of Resonant Devices Using Permeable Polysilicon", Proc. of the 12th International 1999 (C) IEEE. pp. 470-475.

Michael Cohn, et al., "Wafer-To-Wafer Transfer of Microstructures For Vacuum Packaging". Technical Digest of the Solid-State Sensor and Actuator Workshop, Hilton Head, South Carolina Jun. 2-6, 1996. pp. 32-35. (1996).

Rao R. Tummala, et al., Fundamentals of Microsystems Packaging. Chapter 11, (Dr. John Prymak, et al. "Fundamentals of Passive: discrete, integrated, and embedded"), McGraw-Hill, New York 2001. pp. 420-465.

Audet, S.A., Edenfeld, K.M., and Bergstrom, P.L., "Motorola wafer-level pakcaging for integrated sensors", Micromachines Devices 2 (1), pp. 1, 3 (1997).

Audet, S.A. and Edenfeld, K.M., "Integrated Sensor Wafer-Level Packaging", Motorola, Inc. 1997 IEEE 0-7803-3829-4/97. Transducers '97. pp. 287-289.

* cited by examiner

WIRELESS DEVICE
1770

MODULE
1700

DIPOLE ANTENNA
1772

GSM TRANSCEIVER
1774

FIG. 17

MODULE INTEGRATING MEMS AND PASSIVE COMPONENTS

BACKGROUND

1. Field

An embodiment of the invention relates to an apparatus including one or more microelectromechanical systems (MEMS) and one or more passive components.

2. Background Information

Microelectromechanical systems (MEMS) are generally packaged in order to protect their generally fragile mechanical structures from damage and shield them from the environment. Ceramic, glass, and other dedicated packages may be used to package the MEMS. However, the packages often tend to be costly and large.

Passive components, such as, for example, capacitors and inductors, are occasionally employed along with the packaged MEMS. The passive components are generally employed as discrete components, such as individual capacitors and inductors. The discrete components may be assembled onto a board, along with the packaged MEMS. However, the separate assembly of the discrete components and the packaged MEMS onto the board tends to be time consuming and costly, and the assembly tends to be large.

BRIEF DESCRIPTION OF THE SEVERAL VIEWS OF THE DRAWINGS

The invention may best be understood by referring to the following description and accompanying drawings that are used to illustrate embodiments of the invention. In the drawings.

DETAILED DESCRIPTION

In the following description, numerous specific details are set forth. However, it is understood that embodiments of the invention may be practiced without these specific details. In other instances, well-known circuits, structures and techniques have not been shown in detail in order not to obscure the understanding of this description.

Figure 1:
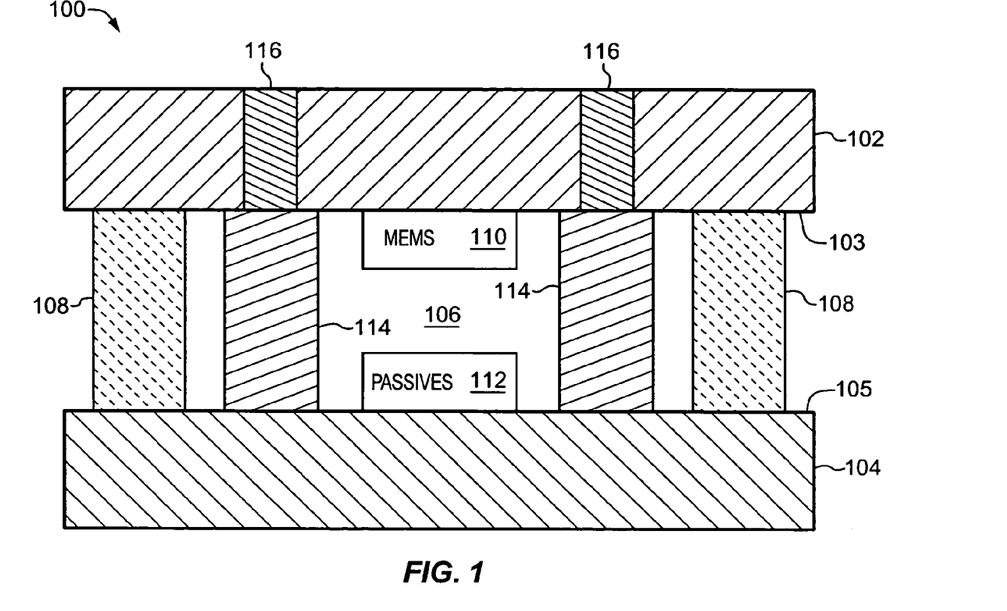
FIG. 1 shows an enlarged cross-sectional view of a package or module, according to one embodiment of the invention.

FIG. 1 shows an enlarged cross-sectional view of a package or module 100, according to one embodiment of the invention. The module includes a first substrate 102, a second substrate 104, a chamber 106 between the first substrate and the second substrate, a seal 108 between the first substrate and the second substrate and around a periphery of the chamber, one or more microelectromechanical systems (MEMS) 110 coupled with the first substrate within the chamber, one or more passive components 112, which are sometimes referred to simply as passives, coupled with the second substrate within the chamber, interconnects 114 within the chamber to couple the first substrate with the second substrate, and vias 116 coupled with the interconnects to couple the module with a signaling medium that is external to the module.

The module 100 includes the first substrate 102 and the second substrate 104. The substrates generally refer to workpiece objects having portions that have been transformed by a sequence of operations into microelectronic circuits, structures, or other configurations. In one aspect, the first substrate and the second substrate may each include a die. The die may be singulated or otherwise separated from a wafer, for example. Dice are also occasionally referred to as chips, monolithic devices, semiconductor devices, integrated circuits, or microelectronic devices. The die or wafer may include a semiconductor material (for example silicon), non-semiconductor material, or a combination of semiconductor and non-semiconductor materials. In one aspect, silicon die or wafers may be used for both the substrates to provide substantially better thermal matching than a ceramic or glass "lid wafer".

In the illustrated embodiment, a lower surface 103 of the first substrate is facing, and is generally aligned above, an upper surface 105 of the second substrate. It should be noted that terms such as, for example, "upper", "lower", "top", "bottom", "right", "left", "vertical", and the like, are used herein to facilitate the description of the structure of the module as illustrated. It will be evident that the apparatus may be used in a variety of orientations including, but not limited to, an inverted orientation in which the passive components are on top, and the MEMS are on the bottom.

Between the first substrate and the second substrate is the chamber 106. Around a periphery of the chamber, and between the first substrate and the second substrate, is the seal 108. In the illustrated orientation, the seal may form the walls of the chamber, and the first and the second substrate may respectively form the ceiling and the floor of the chamber, although other embodiments of the invention are not so limited.

The seal 108 may include a material or device of closure or containment of the chamber 106. The seal may tend prevent, or at least reduce, the exchange of materials between the chamber and an environment surrounding the chamber. For example, the seal may tend to reduce the entry of ambient air, water (for example moisture), or other materials in the chamber, reduce the pressurization of a vacuous chamber, reduce the loss of pressure from a pressurized chamber, and/or limit the escape of a noble gas, other inert material, or other material that is included in the chamber.

In one embodiment of the invention, the chamber 106 may include a hermetically sealed chamber, and the seal may include a hermetic seal, although this is not required. The hermetically sealed chamber may be generally airtight or impervious to water (for example moisture), air, or another material that may be present in the environment surrounding the chamber or module. This may help to protect structures in the chamber from stiction, corrosion (for example oxidation), or other potential problems associated with air or moisture, for example.

Various materials and devices are suitable for the seal 108. In one embodiment of the invention, the seal may include a dedicated ring of sealing material that extends around a periphery of the chamber. The sealing material may include a metal (for example gold, a solder, a eutectic metal, or a thermocompression metal), a frit glass, or an adhesive (for example epoxy resin, benzocyclobutene, or other organic polymeric material), to name just a few examples. As used herein, unless stated otherwise, the term "metal" may refer to either a pure metal (for example gold, aluminum, copper, etc.), or an alloy, mixture, stacks, or other combination of metals. Metals and frit glass tend to provide hermetic seals. Metals tend to be conducting, whereas frit glass and certain adhesives tend to be insulating.

As used herein, the term "ring" does not necessarily imply circularity. The ring may include a circular, rectangular, square, polygonal, or other closed plane shape. In one aspect, the ring of sealing material may be formed on the substrate by deposition, electroplating, or printing, for example. In another aspect, a preformed ring of sealing material, such as, for example, a solder ring, or plastic ring (for example an epoxy resin ring or benzocyclobutene ring), may be introduced between the substrates prior to bonding, and then subsequently bonded to the lower surface of the first substrate and the upper surface of the second substrate.

Another suitable seal may include a surface bond between the first substrate and the second substrate. For example, the seal may include an anodic, fusion, or surface-activated bond. These bonds also tend to provide hermetic seals. If such a bond is employed, in one aspect, the MEMS and passive components may optionally be recessed in the substrates relative to the lower surface of the first substrate and the upper surface of the second substrate, for example, in a cavity or other recess.

Coupled with the first substrate, within the chamber, are the one or more MEMS 110. As used herein, the term "MEMS" may be used to refer to either a single microelectromechanical system or multiple microelectromechanical systems. As viewed, the MEMS are physically attached to the lower surface of the first substrate and electrically connected to a microelectronic circuit or other configuration of the first substrate. The microelectronic configuration or circuit may include a signaling medium or path, such as, for example, conductive microelectronic paths, that allow the MEMS to be electrically connected or otherwise coupled with the second substrate. The microelectronic configuration or circuit may include metals, conductive semiconductor materials, or other conductive materials.

The MEMS generally represent miniaturized devices having three-dimensional structure and including both mechanical and electrical components, for example electrically activated moving parts. The MEMS may be released. In one embodiment of the invention, each of the one or more MEMS may have a dimension that is less than a millimeter (mm, one thousandth of a meter), and often (but not always) more than about a micrometer (μm, one millionth of a meter).

In accordance with one or more embodiments of the invention, the MEMS devices may include one or more switches, tunable switches, cantilever beam arrays, resonators, film bulk acoustic resonators (FBARs), FBAR filters, varactors, radio-frequency MEMS, hinged mirrors, pressure sensors, tunable capacitors, or combinations thereof. For clarity, as used herein, the terms "microelectromechanical systems" and "MEMS" may encompass microoptoelectromechanical systems (MOEMS) that include an optical component.

MEMS are occasionally known as micromachines (for example in Japan), or micro systems technology devices (for example in Europe). As used herein, the terms "microelectromechanical system" and "MEMS" are intended to encompass devices referred to by the terms micromachine and/or micro systems technology device.

Coupled with the second substrate, within the chamber, are the one or more passive components 112. As viewed, the passive components are physically attached to the upper surface of the second substrate and electrically connected to a microelectronic configuration or circuit of the second substrate. Suitable passive components include, but are not limited to, resistors, capacitors, inductors, and combinations thereof.

The MEMS 110 are integrated in a single module 100 with the passive components 112. A ceramic "lid wafer", which may tend to be large and expensive, is not required to package the MEMS. Instead, the second substrate, which includes the passive components, may be used to package the MEMS. Additionally, the assembly of a separately packaged MEMS and individual discrete passive components to a board is not required. This may tend to reduce the time and costs of assembly, as well as reduce the size of the module. A smaller module may be better suited for deployment in a small electronic device, such as, for example, a cellular phone, personal digital assistant, PCMCIA (Personal Computer Memory Card International Association) card, or the like.

The module further includes the interconnects 114. The interconnects are located within the chamber, between the first substrate and the second substrate, within the perimeter or confines of the seal.

The interconnects may include structures including electrically conductive materials to electrically couple the first substrate with the second substrate through a conductive path, link, or signaling medium. A variety of interconnect structures are known. Suitable interconnects include, but are not limited to, bumps, solder bumps, bondpads, traces, wires, and combinations thereof.

Metals are commonly employed in the interconnects, due, at least in part, to their high conductivities. However, electrically conductive materials or conductors other than metals are also suitable. For example, the interconnects may include a doped polysilicon, doped single-crystal silicon, refractory metal silicide, or a combination of such materials.

As viewed, top terminal ends or portions of the interconnects are physically attached and electrically connected to the microelectronic configuration or circuit of the first substrate, and bottom terminal ends or portions of the interconnects are physically attached and electrically connected to the microelectronic configuration or circuit of the second substrate. In the illustrated embodiment, the interconnects are on the right and left sides of the MEMS and passive components, although this is not required.

The module further includes the vias 116. The vias are an example of a conductive path that may be used to connect the module to an external signaling medium, such as, for example, a circuit, printed circuit board, or other portion of an electronic device, to name a few examples. The vias may include vertical holes or other openings through an entire thickness of a substrate that are filled with, or otherwise include, a metal or other conductive material. Suitable metals include, but are not limited to, aluminum, copper, gold, and solders. The openings may be filled with such metals by electroplating, electroless plating, or physical vapor deposition, for example.

In the illustrated embodiment, the vias include openings through an entire thickness of the first substrate, although this is not required. In alternate embodiments of the invention, the vias may be through the second substrate, or some vias may be through the first substrate and other vias may be through the second substrate.

The vias are generally located over or under the interconnects. In the illustrated embodiment, the vias are located over the interconnects. In particular, each of the vias includes a first terminal end or portion, and a second terminal end or portion. In the illustrated embodiment, the first terminal end or portion (for example the bottom) of each of the vias is physically attached to and electrically connected to one of the interconnects. The second terminal end or portion (for example the top) of each of the vias is outside of the chamber, and forms an external surface of the module.

Figure 2:
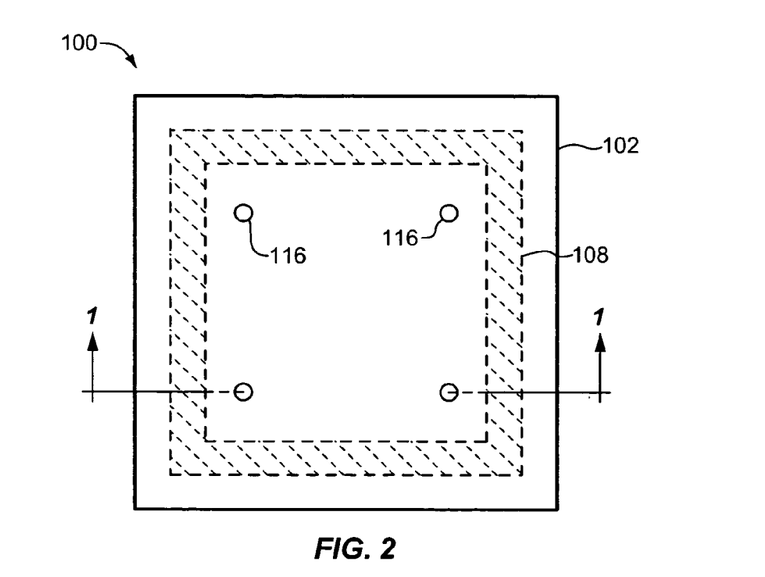
FIG. 2 shows a top planar view of the module of FIG. 1.

FIG. 2 shows a top planar view of the module 100 of FIG. 1. A section line 1—1 shows the location of the cross-section used for FIG. 1. To facilitate illustration, the size selected for the top view is slightly reduced compared to the size of the cross-sectional view. Also, some hatching is omitted to avoid obscuring the view.

Viewed from the top, dashed lines are used to show the location of the seal 108, which is underneath the first substrate 102, and hidden. Within the perimeter of the seal are tops of the vias 116. In the illustrated embodiment, the tops of four vias are shown, arranged in a reticulated or grid-like arrangement, with two vias on each side. However, this particular number and arrangement of vias is not required.

The tops of the vias are exposed, and are accessible from the outside of the module. The tops may be used to electrically connect circuitry inside the module, such as, the MEMS and passive components, for example, to an external signaling medium. Conductors, such as, for example, solder bumps, metal wires, or the like, may be connected between the tops and the external signaling medium. In one aspect, the tops may be connected to the external signaling medium through a surface mount technology (SMT), for example.

Figure 3:
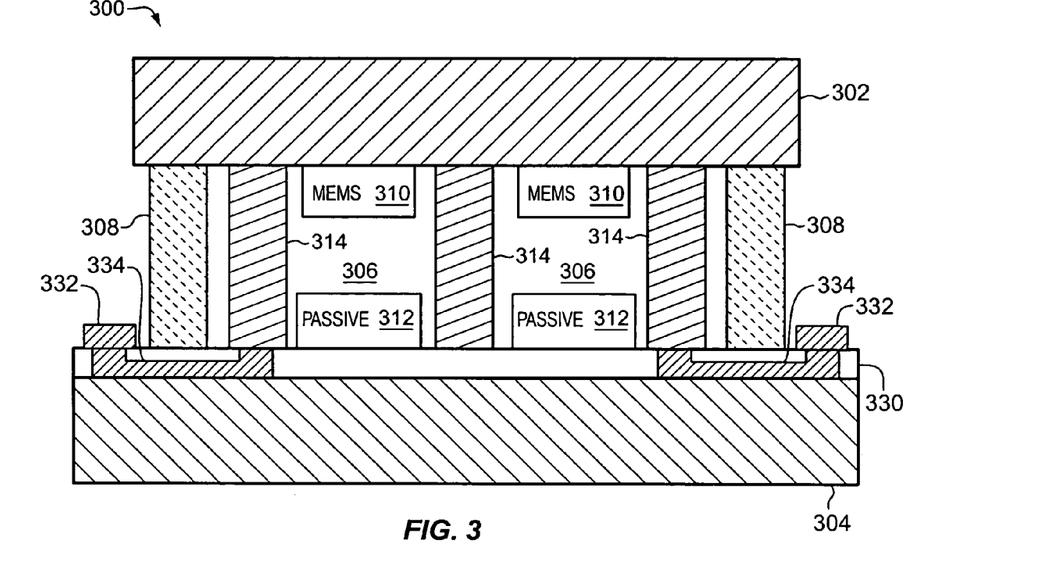
FIG. 3 shows an enlarged cross-sectional view of a module, according to another embodiment of the invention.

In another embodiment of the invention, conductive paths other than the vias may optionally be employed to connect circuitry within the module with an external signaling medium. FIG. 3 shows an enlarged cross-sectional view of a module 300 that includes an insulating layer 330, conductive pads 332 over the insulating layer on the outside of the module, and conductive paths 334 that are at least partially buried in the insulating layer which lead from conductors inside of the module (for example interconnects) to the conductive pads, according to one embodiment of the invention.

In addition to the insulating layer, the conductive pads, and the conductive paths, the module also includes a first substrate 302, a second substrate 304, a chamber 306, a seal 308, MEMS 310, passive components 312, and interconnects 314. Two or more MEMS and passive components are shown, in this embodiment, although this is not required. These components may optionally have some or all of the characteristics of the correspondingly named components of the module 100 shown in FIGS. 1–2. To avoid obscuring the following description, the discussion below will primarily focus on the different and/or additional structures and characteristics of the module 300.

In the illustrated embodiment, the insulating layer 330 is disposed between the second substrate and the passive components, although this is not required. In alternate embodiments of the invention, the insulating layer may be disposed between the first substrate and the MEMS, or between both the second substrate and the passive components and the first substrate and the MEMS.

In one aspect, the insulating layer may include an oxide of silicon (for example silicon dioxide, $SiO_2$), although this is not required. Other insulating materials or dielectrics, such as, for example, polymeric foams or other organic insulating materials may also optionally be employed. A separate or dedicated insulating layer is not required if the substrate is sufficiently insulating to prevent a short.

The conductive paths 334 are disposed in the insulating layer 330 and may lead from conductors inside of the module, such as, for example, the interconnects 314, to the conductive pads 332. The conductive paths may include trenches or other openings in the insulating layer that are filled with, or otherwise include, a metal or other conductive material. The insulating layer and conductive paths may be formed on the substrate by deposition, such as chemical vapor deposition (CVD) or physical vapor deposition (PVD) (e.g., sputtering), for example, and lithographically patterned using etching, such as wet chemical or plasma etching, for example. Suitable conductive materials include, but are not limited to, aluminum, copper, gold, solders, other metals, and other conductive materials, such as, for example, appropriately doped semiconductors. The trenches may be formed by sawing or etching, for example, followed by metal deposition.

In one embodiment of the invention, at least a portion of the conductive paths may be buried in the insulating layer. In the illustrated embodiment, central portions of the conductive paths under or otherwise proximate the seal are buried in the insulating layer. If the seal is conductive, this may help to prevent an electrical connection. Alternatively, the seal may include an insulating material, such as, for example, a frit glass or insulating organic material, in which case the conductive paths may not be buried.

Each of the conductive paths has a first terminal end or portion and a second terminal end or portion. Each first terminal end may emerge from the insulating layer and may be coupled with one of the interconnects 314. Each second terminal end may emerge from the insulating layer and maybe coupled with one of the conductive pads 332 outside the module.

The conductive pads 332 overly the insulating layer and the second terminal ends of the conductive paths. The conductive pads may include a conductive material, such as, for example, aluminum, copper, gold, solder, or another metal, or another conductive material, for example a metal silicide. The conductive pads may be used to electrically connect or couple the module to an external signaling medium, for example, through wirebonding. Often, a thin gold wire, for example having a diameter of about thirty micrometers, may be used as a package lead to connect to the pads. As shown, a dimension, such as a length and a width, of the first substrate may be less than a dimension of the second substrate to provide greater accessibility to the conductive pads.

Figure 4:
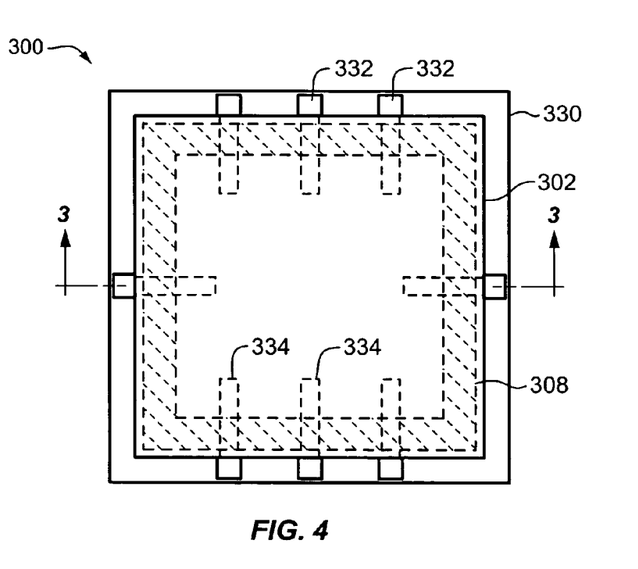
FIG. 4 shows a top planar view of the module of FIG. 3.

FIG. 4 shows a top planar view of the module 300 of FIG. 3. A section line 3—3 shows the location of the cross-section used for FIG. 3. To facilitate illustration, the size selected for the top view is slightly reduced compared to the size of the cross-sectional view. Also, some hatching is omitted to avoid obscuring the view.

Viewed from the top, the top surfaces of the first substrate 302, the insulating layer 330, and the conductive pads 332 are visible. Dashed lines are used to show the location of the seal 308, and the conductive paths 334, which may be underneath the first substrate, and hidden. Within the perimeter or confines of the seal are the first terminal ends of each of the conductive paths, which may each be coupled or connected with an interconnect.

In one embodiment of the invention, the modules 100, 300 that are shown in FIGS. 1–2 or 3–4, respectively, may be provided in an unconnected form in which the vias 116 or conductive pads 332, respectively, are not connected to an external signaling medium. Alternatively, in another embodiment of the invention, the modules 100, 300 may be provided in a connected form in which the vias 116 or conductive pads 332, respectively, are connected to an external signaling medium.

Figure 5:
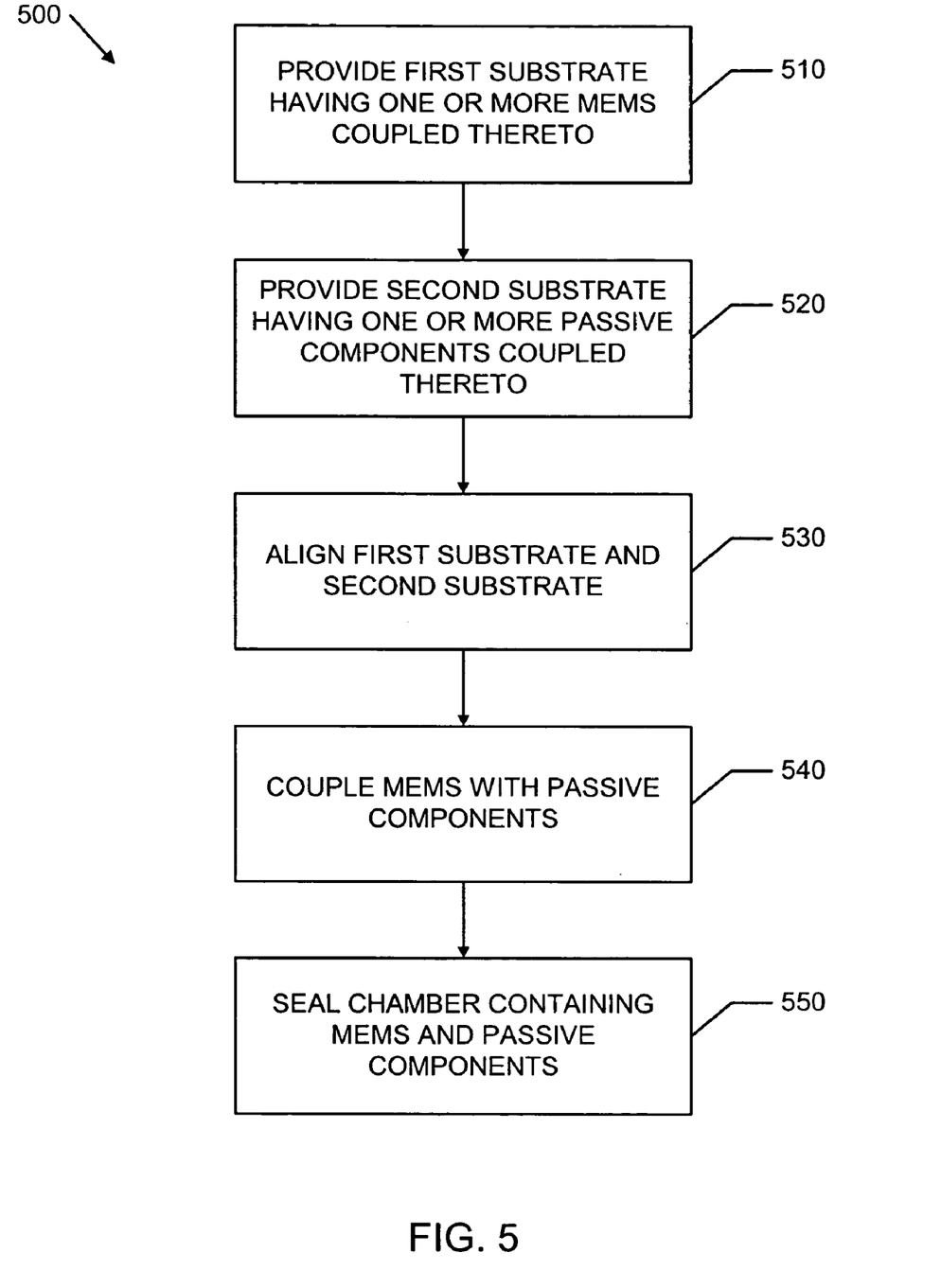
FIG. 5 shows a method of making a module or bonded wafer assembly, according to one embodiment of the invention.

FIG. 5 shows a method 500 of making a module or other apparatus, such as, for example, a bonded wafer assembly, according to one embodiment of the invention. The method includes providing a first substrate, such as a wafer or die, for example, having one or more MEMS coupled thereto, at block 510, and providing a second substrate, such as a wafer or die, for example, having one or more passive components coupled thereto, at block 520.

Providing the substrates may include fabricating, purchasing, or otherwise providing the substrates. In one embodiment of the invention, a first wafer and MEMS may be fabricated by one sequence of operations, and a second wafer and passive components may be fabricated by another, different sequence of operations. The process or sequence used to fabricate the MEMS and the passive components are generally sufficiently diverse that it is appropriate to provide the MEMS and passive components on different, separately fabricated wafers, in order to avoid a more complicated and usually more expensive combined process.

Then, the first substrate, having the one or more MEMS coupled thereto, and the second substrate, having the one or more passive components coupled thereto, may be aligned, at block 530. In one aspect, an active surface of the first substrate having the MEMS may be aligned face-to-face with an active surface of the second substrate having the passive components. In one embodiment, the substrates may be introduced in an alignment tool, such as, for example, a bond aligner. The bond aligner or other tool may precisely align the substrates. In one aspect, the bond aligner may take photographs of the active surfaces of the substrates, including the MEMS and passive components, and use the photographs to align the substrates.

Next, the aligned substrates may be coupled. The one or more MEMS may be electrically coupled with the one or more passive components, at block 540. The coupling may include forming an interconnect or other conductive path from a microelectronic configuration or circuit of the first substrate to a microelectronic configuration or circuit of the second substrate. The interconnect or other conductive path may complete a circuit that includes the one or more MEMS and the one or more passive components.

A chamber containing or otherwise including the one or more MEMS and the one or more passive components may be sealed, at block 550. A seal may be formed by bonding a sealing material between the substrates, or by forming a surface bond between the substrates, to name a few examples. In addition to providing protection to the MEMS, the seal may help to provide physical integrity to the module.

Figure 6:
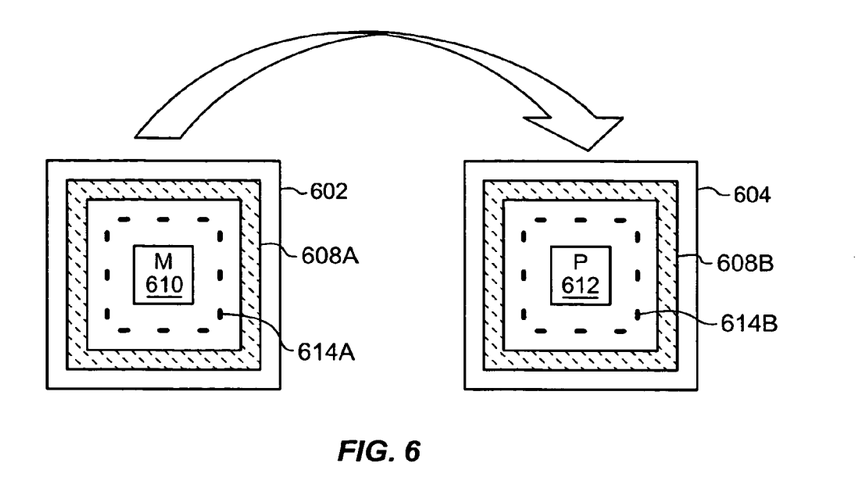
FIG. 6 shows forming a module by coupling a first die with a second die, according to one embodiment of the invention.

FIG. 6 shows forming a module by coupling a first die 602 with a second die 604, according to one embodiment of the invention. The first die 602 has one or more MEMS (M) 610, a ring of sealing material 608A, and interconnect material (for example metal bondpads) 614A, coupled therewith. The second die 604 has one or more passive components (P) 612, a matching or otherwise corresponding ring of sealing material 608B, and matching or otherwise corresponding interconnect material (for example matching metal bondpads) 614B, coupled therewith.

"Matching" or "corresponding" generally means that the rings and interconnect materials generally match or correspond in position when the substrates are aligned. They may also optionally match or correspond in size, shape, or other attributes. The use of matching or corresponding sealing and interconnect materials is not required. In an alternate embodiment of the invention, a single sealing ring or material and/or interconnect material may be used to couple the dice or wafers. For example, a single preformed solder ring or solder bumps extending the full distance between the substrates may be used.

In one embodiment of the invention, the corresponding rings 608A, 608B and interconnect materials 614A, 614B may each include patterned metal layers that have been patterned, for example, from native metal layers of the substrates. Thick metal layers that are often used to fabricate passive components may be used as sealing and/or interconnect materials. Conductive paths buried in an insulating layer, which are often available in a passives wafer fabrication process, may be used as previously described to connect the module to an external signaling medium. In one aspect, the patterned metal layers may each include a stack of two or more abutting metal layers that have been patterned by lithography or micromachining, for example. As one specific example, the stack may include, from the substrate going outward, about five microns of nickel, then about five microns of a gold-tin eutectic solder, such as an 80% gold, 20% tin solder, for example. The nickel may serve as a standoff to provide additional separation between the substrates, and may serve as a wettable adhesion layer for the gold-tin solder, which may be used to form a strong mechanical and electrical coupling to corresponding features on the opposing substrate. In such an embodiment, the same or similar stack may optionally be used for both rings of sealing material and the interconnect materials. The use of patterned metal layers and stacks is not required.

Referring again to FIG. 6, in coupling the dice 602, 604, the dice may be aligned, and then brought in close proximity. Either one or both of the dice may be moved. At some point, as the dice are brought close together, the ring of sealing material 608A and the corresponding ring of sealing material 608B may come in contact. At about the same or similar time, the interconnect material 614A and the corresponding interconnect material 614B may come in contact.

The contacted sealing and interconnect materials may be bonded together. Depending upon the particular materials, a variety of bonding techniques may be used. The interconnect materials may be bonded together using methods including, but not limited to, solder reflow, thermocompression bonding, and other metal bonding methods. Depending upon the sealing material, these methods may be suitable, as well as methods such as, for example, frit glass bonding, adhesive bonding, anodic bonding, fusion bonding, and surface-activated bonding, to name a few. In one aspect, a flip-chip type tool may be used for the bonding. The bonding of these materials may form a seal around an internal chamber and interconnects within the chamber.

Figure 7:
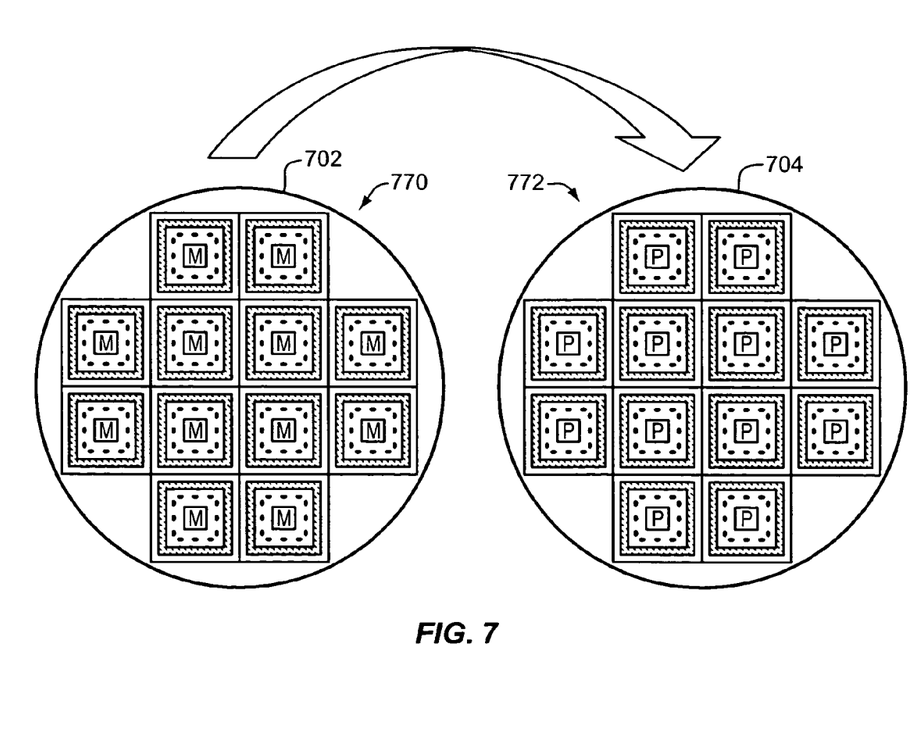
FIG. 7 shows forming a bonded wafer assembly by coupling a first wafer with a second wafer, according to one embodiment of the invention.

FIG. 7 shows forming a bonded wafer assembly including unsingulated modules by coupling a first wafer 702 with a second wafer 704, according to one embodiment of the invention. The first wafer 702 includes an array 770 of twelve unsingulated dice, and the second wafer 704 includes a corresponding array 772 of twelve unsingulated dice. In general, each wafer may include two or more unsingulated dice. The dice may include electronically independent but unseparated microelectronic devices.

The wafers may be aligned such that the die of the first wafer and the corresponding die of the second wafer are aligned and so that the rings and interconnects materials thereof correspond in position. Then, after alignment, the wafers may be contacted and coupled, as previously described. In one aspect, a wafer bonder may be used to couple the wafers.

The coupled wafers may include an array of sealed chambers between the first wafer and the second wafer. Within each of the chambers, coupled with the first wafer, may be included one or more MEMS. Within each of the chambers, coupled with the second wafer, may be included one or more passive components. Also, within each of the chambers, coupled with the first wafer and the second wafer, may be included interconnects to couple the one or more MEMS with the one or more passive components. The coupled wafers may then be singulated, diced, or otherwise separated into individual modules.

Wafer bonding may allow for parallel production of modules and may tend to reduce manufacturing costs. Additionally, sealing the MEMS within the chambers of the modules prior to singulation and cleaning may help to protect the generally fragile structures of the MEMS from damage. It may be appropriate to bond the wafers shortly after release of the MEMS in order to reduce the potential for particle contamination and stiction.

Referring again to FIGS. 3–4, the module 300 includes external interconnect structures, in this particular case conductive pads 332, that may be used to electrically connect the module with an external signaling medium, such as, for example, a printed circuit board. As shown, a cross sectional dimension or width of the first substrate 302 may be less than a corresponding dimension or width of the second substrate 304 to allow greater access to the conductive pads. Various methods of providing access to the pads or other external interconnect structures are contemplated.

FIGS. 8–11 show cross-sectional views of wafers and assemblies representing different stages of a method of making modules that includes exposing external interconnect structures in a wafer bonding sequence, prior to singulation, according to one embodiment of the invention.

Figure 8:
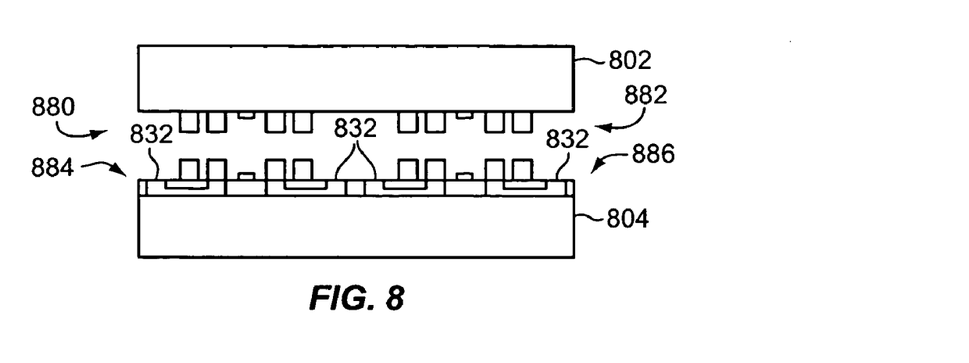
FIG. 8 shows aligning a MEMS wafer over a passive components wafer, according to one embodiment of the invention.

FIG. 8 shows aligning a MEMS wafer 802 over a passive components wafer 804. The MEMS wafer includes a first unsingulated die 880 (on the left) and a second unsingulated die 882 (on the right). The passive components wafer includes a first matching or otherwise corresponding unsingulated die 884 (on the left) and a second matching or otherwise corresponding unsingulated die 886 (on the right). External conductive pads 832 are located on a surface of the passive components wafer.

Figure 9:
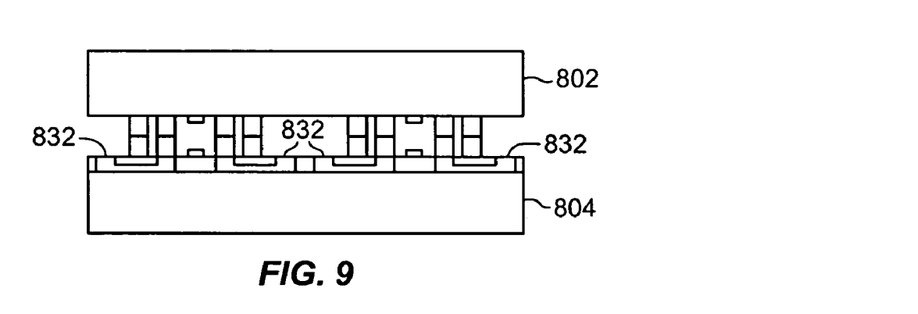
FIG. 9 shows coupling the aligned wafers of FIG. 8, according to one embodiment of the invention.

FIG. 9 shows coupling the aligned wafers of FIG. 8. In the coupled assembly the MEMS wafer 802 may tend to conceal the conductive pads 832. This may complicate or prevent connection with an external signaling medium.

Figure 10:
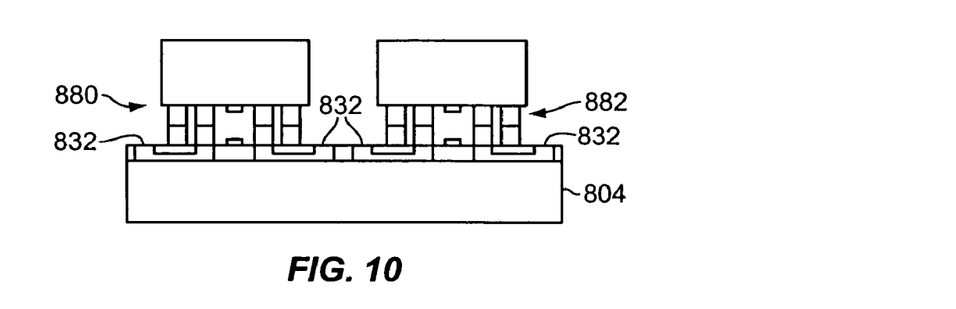
FIG. 10 shows removing a portion of the MEMS wafer of FIG. 9 to expose interconnect structures, according to one embodiment of the invention.

FIG. 10 shows removing portions of the MEMS wafer 802 of FIG. 9 over the conductive pads 832, in order to provide greater access to the conductive pads, prior to singulation or dicing. In one embodiment of the invention, the portions that are removed may include an entire thickness of the MEMS wafer, along perimeters of the dice 880, 882. For simplicity, two dice are shown, although it will be apparent that the removal may be done around an entire array of dice.

In one aspect, the portions may be removed by sawing with a wide saw blade. The blade may have a width that is greater than a width of a saw blade that is subsequently used for singulating the coupled wafers. In removing the portions, the seal generally should not be cut or damaged. The saw blade may be stopped before cutting the passive components wafer. Other methods of removing the portions of the substrate, such as, for example, etching, laser ablation, and the like, may also optionally be employed.

Figure 11:
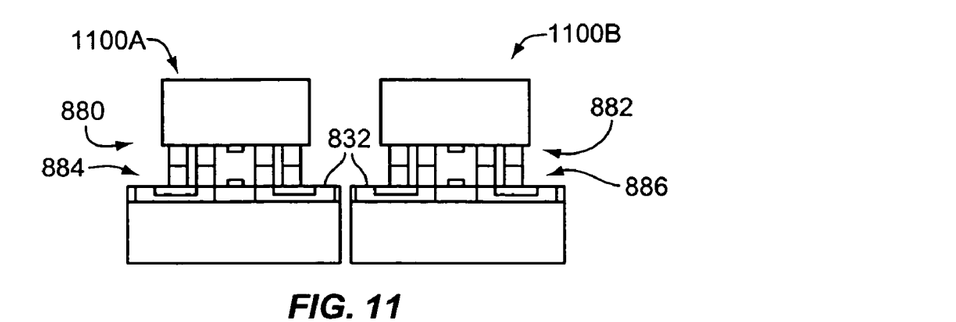
FIG. 11 shows singulation of the bonded wafer assembly of FIG. 10 to form modules, according to one embodiment of the invention.

FIG. 11 shows singulation of the assembly of FIG. 10 to form a first module 1100A and a second module 1100B. The first 1100A and the second module 1100B include the bonded dice 880, 884, and 882, 886, respectively. The singulation cuts may be around a perimeter of the external conductive pads or other interconnect structures. In one aspect, the singulation may be achieved with a conventional singulation saw.

In another embodiment of the invention, at least some of the cutting or other removal of the wafer may be done prior to alignment and bonding. FIGS. 12–15 show cross-sectional views of wafers and assemblies representing different stages of a method of making modules that includes exposing external interconnect structures in a wafer bonding sequence, prior to singulation, where at least a portion of a wafer is removed prior to alignment and bonding, according to one embodiment of the invention.

Figure 12:
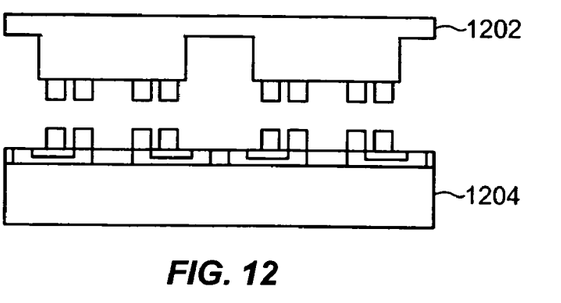
FIG. 12 shows aligning a MEMS wafer, having a portion removed therefrom, over a passive components wafer, according to one embodiment of the invention.

FIG. 12 shows aligning a MEMS wafer 1202, which already has a portion removed, over a passive components wafer 1204. Prior to aligning the wafers, a portion of the MEMS wafer has already been removed. The portion includes trenches, through less than an entire thickness of the MEMS wafer, along perimeters of dice, on an active surface of the MEMS wafer, where the MEMS are attached. In one embodiment of the invention, the depth of the trenches may be from about ¼ to ¾ of the thickness of the MEMS wafer, for example. These portions may optionally be removed by sawing with a saw blade that has a width that is greater than a width of a saw blade that is subsequently used to singulate the dice, or by etching, laser ablation, or other micromachining, for example.

Figure 13:
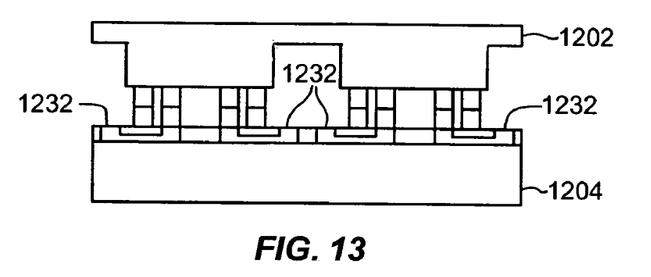
FIG. 13 shows coupling the aligned wafers of FIG. 12, according to one embodiment of the invention.

FIG. 13 shows coupling the aligned wafers of FIG. 12. As shown, the MEMS wafer 1202 may still tend to at least partially conceal the conductive pads 1232 and complicate connection with an external signaling medium. In one embodiment of the invention, further removal may be used prior to singulation to provide even greater access to the pads.

Figure 14:
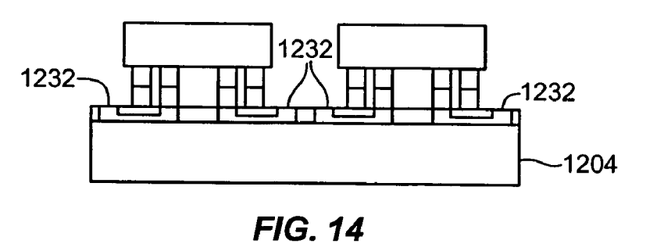
FIG. 14 shows removing another portion of the MEMS wafer, after coupling the wafers as shown in FIG. 13, in order to provide access to interconnect structures, according to one embodiment of the invention.

FIG. 14 shows removing another portion of the MEMS wafer, after coupling the wafers as shown in FIG. 13, in order to provide access to the conductive pads. The portion is removed prior to singulation. In one embodiment of the invention, the portion may include at least a remaining thickness of the MEMS wafer where the partial thickness was previously removed. The portion may be removed by backgrinding (as shown), or by sawing from the opposite direction, for example, with a wide saw blade. If a saw is used to remove the portion, the prior removal of the initial portion may reduce the influence of accurate vertical control of the saw, and may reduce potential wear or abrasion of the passive components substrate due to sawing (for example particle abrasion). Other substrate removal methods, such as, for example, etching, laser ablation, or the like, may also optionally be employed.

Figure 15:
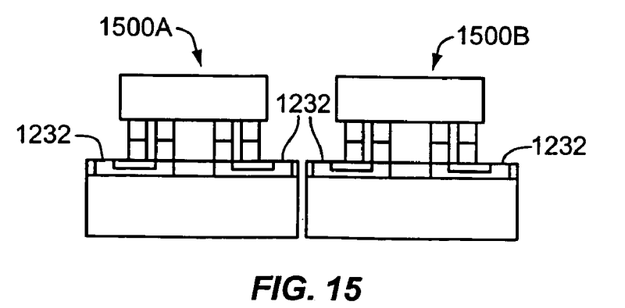
FIG. 15 shows singulation of the bonded wafer assembly of FIG. 14 to form modules, according to one embodiment of the invention.

FIG. 15 shows singulation of the assembly of FIG. 14 to form a first module 1500A and a second module 1500B. The singulation may optionally be performed with a conventional singulation saw.

Figure 16:
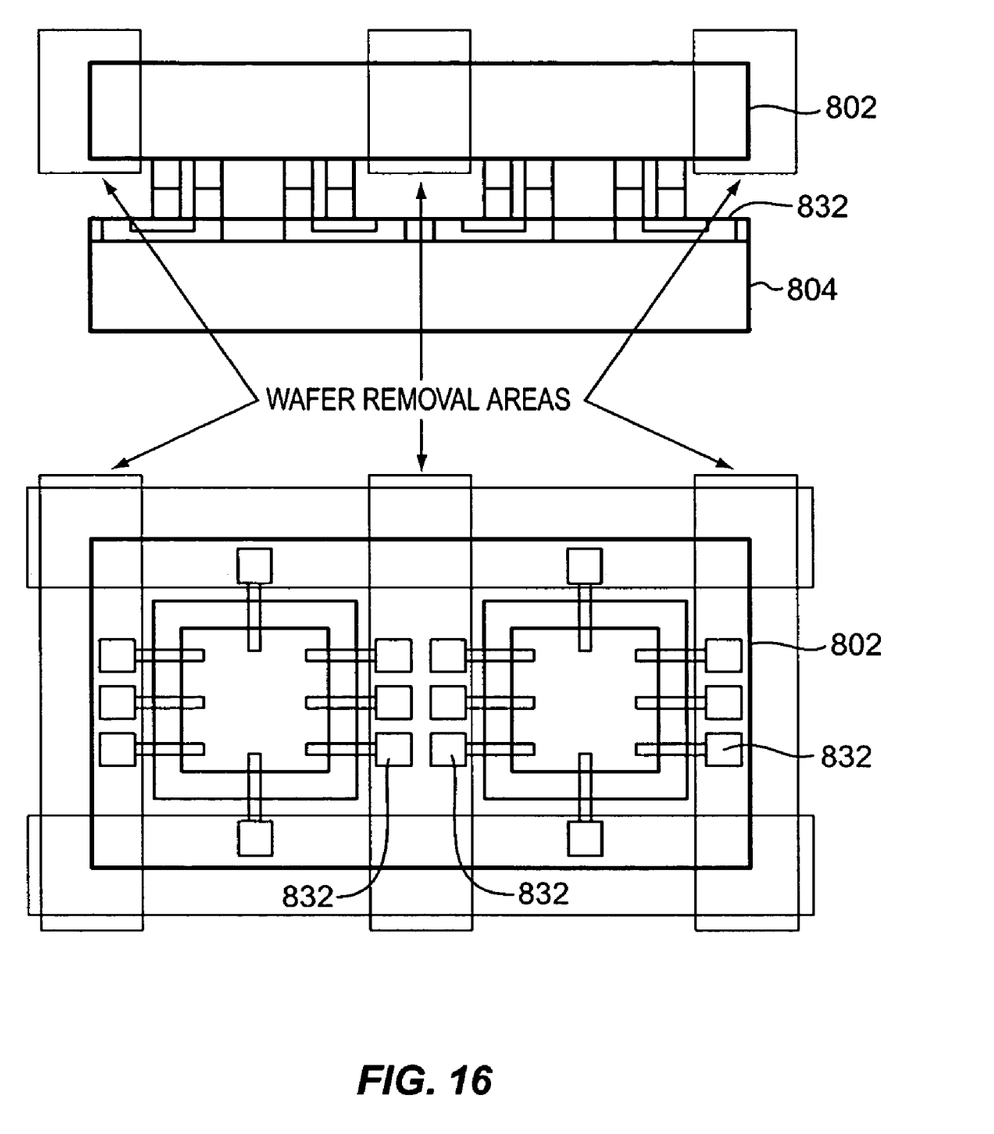
FIG. 16 shows corresponding cross-sectional and top planar views of areas of the MEMS wafer that may be removed to provide access to interconnect structures, according to one embodiment of the invention.

FIG. 16 shows corresponding cross-sectional (on the top of the page) and top planar (on the bottom of the page) views of areas of the MEMS wafer 802 of FIG. 8 that may be removed, according to one embodiment of the invention. The top planar view looks down on the MEMS wafer and shows underlying structures, such as the conductive pads 832, that would be hidden from view, in order to better illustrate the removal areas. In the case of employing backgrinding in the removal, a thickness of the wafer may also be removed.

Figure 17:
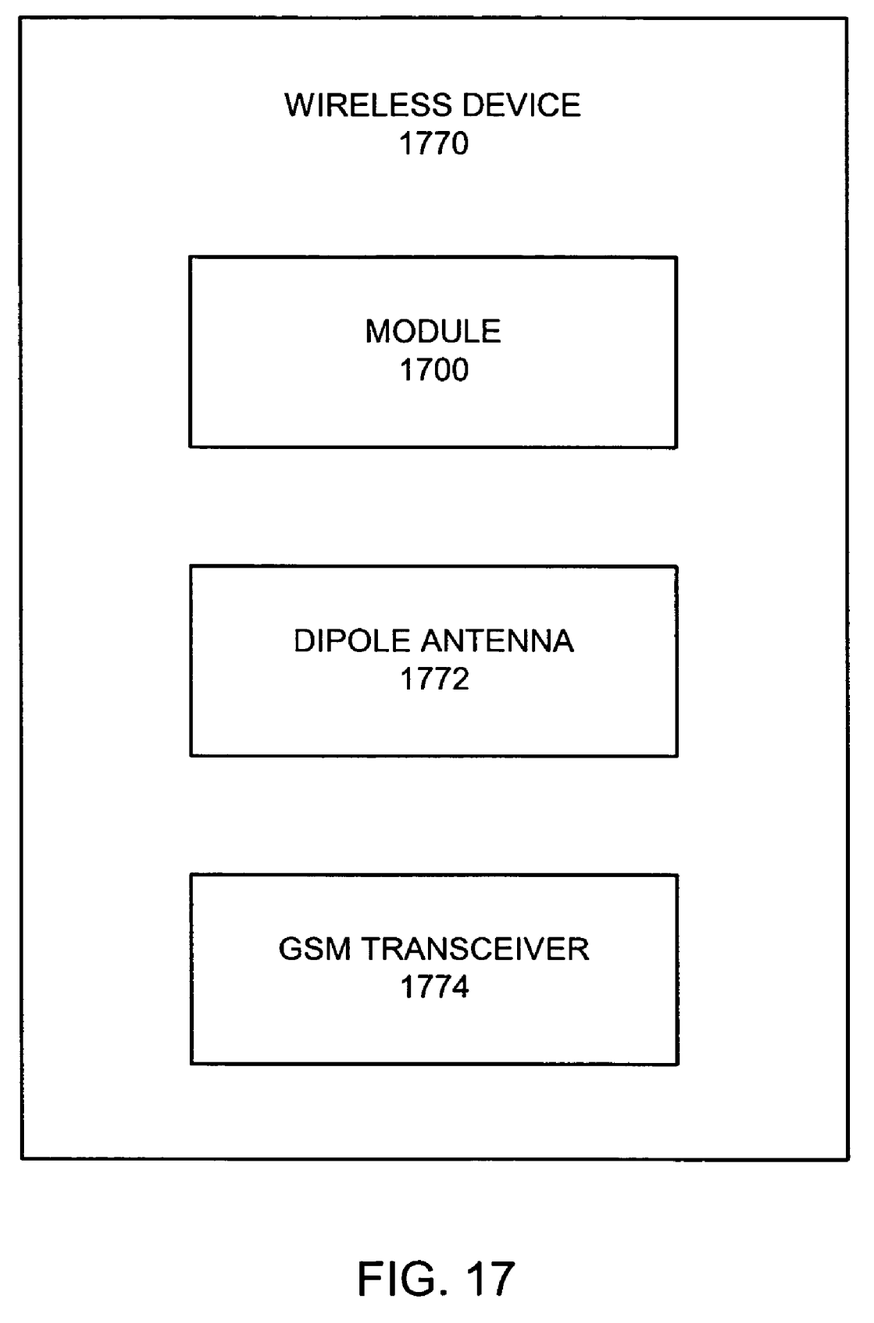
FIG. 17 shows a wireless device including a module as disclosed herein, a GSM transceiver, and an antenna, according to one embodiment of the invention.

The modules disclosed herein may be included and employed in a wide variety of electronic devices. FIG. 17 shows a wireless device 1770, according to one embodiment of the invention. The wireless device may include a cellular phone, personal digital assistant (PDA), computer card (for example local area network (LAN) card), or laptop computer, to name just a few examples.

The wireless device includes a module 1700. The module may have any one or more of the characteristics of the modules described elsewhere herein. In one embodiment of the invention, the module may be employed as a front-end module, or a smart antenna, for example, for a wireless device supporting a cellular, wireless local area network (WLAN), or ultrawideband (UWB) standard, for example. The module may include a MEMS switch, and one or more passive components. The switch may turn on-or-off or select various filters for different frequencies, for example. Compared to a microelectronic switch, the MEMS switch may tend to exhibit lower losses (for example be relatively more "on" and/or more "off"). This may prove to be useful in reducing power loss, and may extend battery life, for example. In another embodiment, the module may alternately include a FBAR filter and one or more passive components.

The wireless device also includes a dipole antenna 1772 and a GSM (Global System for Mobile communications) transceiver 1774. The dipole antenna may allow the wireless device to send and receive data. In another embodiment of the invention, the device may include an omnidirectional antenna. The GSM transceiver may allow the apparatus to utilize CDMA (Code Division Multiple Access), TDMA (Time Division Multiple Access), and/or W-CDMA (Wideband Code Division Multiple Access) communications, for example. Dipole antennas, omnidirectional antennas, and GSM transceivers are used in some, but not all, wireless devices. The wireless device may also include other optional components, which are not shown, such as a Flash memory, for example. In the case of the wireless device including a laptop computer, it may optionally include a DRAM memory, SRAM memory, graphics controller, or audio device, for example.

In the description above, for the purposes of explanation, numerous specific details have been set forth in order to provide a thorough understanding of the embodiments of the invention. Other embodiments may be practiced without some of these specific details. In other instances, well-known circuits, structures, devices, and techniques have been shown in block diagram form or without detail in order not to obscure the understanding of this description.

Many of the methods are described in their most basic form, but operations may be added to or deleted from the methods. Many further modifications and adaptations may be made. The particular embodiments are not provided to limit the invention but to illustrate it. The scope of the invention is not to be determined by the specific examples provided above but by the claims below.

In the claims, any element that does not explicitly state "means for" performing a specified function, or "step for" performing a specified function, is not to be interpreted as a "means" or "step" clause as specified in 35 U.S.C. Section 112, Paragraph 6. In particular, the use of "step of" in the claims herein is not intended to invoke the provisions of 35 U.S.C. Section 112, Paragraph 6.

It should also be appreciated that reference throughout this specification to "one embodiment" or "an embodiment" means that a particular feature may be included in the practice of the invention. Similarly, it should be appreciated that in the foregoing description of exemplary embodiments of the invention, various features are sometimes grouped together in a single embodiment, Figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the Detailed Description are hereby expressly incorporated into this Detailed Description, with each claim standing on its own as a separate embodiment of this invention.

While the invention has been described in terms of several embodiments, the invention is not limited to the embodiments described, but may be practiced with modification and alteration within the spirit and scope of the appended claims. The description is thus to be regarded as illustrative instead of limiting.

What is claimed is:

1. An apparatus comprising:
   a first die, a second die, and a hermetically sealed chamber between the first die and the second die;
   a seal between the first die and the second die and around a periphery of the chamber;
   one or more microelectromechanical systems attached to the first die within the chamber, the microelectromechanical systems connected with the first die;
   one or more passive components attached to the second die within the chamber, the passive components connected with the second die;
   one or more interconnects within the chamber to connect the first die with the second die; and one or more conductive paths having first terminal ends and second terminal ends, the first terminal ends of each of the conductive paths connected with the interconnects, the second terminal ends accessible from an outside of the chamber.

2. The apparatus of claim 1, wherein the one or more microelectromechanical systems comprise one or more selected from switches and film bulk acoustic resonators.

3. The apparatus of claim 2, wherein the one or more passive components comprise one or more selected from capacitors and inductors.

4. An apparatus comprising:
a first substrate, a second substrate, and a chamber between the first substrate and the second substrate;
a seal between the first substrate and the second substrate and around a periphery of the chamber;
one or more microelectromechanical systems coupled with the first substrate within the chamber;
one or more passive components coupled with the second substrate within the chamber; and
one or more interconnects within the chamber to couple the first substrate with the second substrate; and
one or more conductive paths that each have one end that is coupled with the interconnects and another end that is outside the chamber to couple the interconnects with a signaling medium.

5. The apparatus of claim 4, wherein the first substrate and the second substrate each comprise a singulated die.

6. The apparatus of claim 4, wherein the one or more microelectromechanical systems comprise one or more selected from switches and film bulk acoustic resonators, and wherein the one or more passive components comprise one or more selected from capacitors and inductors.

7. The apparatus of claim 4, wherein the conductive paths comprise vias through either the first substrate or the second substrate.

8. The apparatus of claim 4, further comprising:
an insulating layer, the insulating layer disposed between either the first substrate and the one or more microelectromechanical systems, or the second substrate and the one or more passive components;
one or more conductive pads of the conductive paths, the conductive pads over the insulating layer outside of the chamber;
one or more metal lines of the conductive paths, the metal lines at least partially buried in the insulating layer, each of the metal lines having a first terminal end and a second terminal end, each first terminal end connected with one of the interconnects, each second terminal end connected with one of the conductive pads.

9. The apparatus of claim 4, wherein the seal comprises a ring of sealing material of the first substrate bonded to a corresponding ring of sealing material of the second substrate, and wherein the interconnects within the chamber each comprise a conductive material of the first substrate bonded to a corresponding conductive material of the second substrate.

10. The apparatus of claim 4, wherein the seal comprises a material selected from a metal, a frit glass, an adhesive, or a combination thereof.

11. The apparatus of claim 4, wherein the one or more passive components are fabricated on the second substrate.

12. The apparatus of claim 4, wherein the one or more passive components comprises one or more inductors.

13. A apparatus of comprising:
a first substrate having one or more microelectromechanical systems coupled thereto;
a second substrate coupled with the first substrate, the second substrate having one or more passive components coupled thereto, wherein the substrates each comprise a singulated die; and
a ring of sealing material between the substrates, and around the one or more microelectromechanical systems and the one or more passive components.

14. The apparatus of claim 13, wherein the one or more microelectromechanical systems comprise one or more selected from switches and film bulk acoustic resonators, and wherein the one or more passive components comprise one or more selected from capacitors and inductors.

15. A wireless device comprising a Global System for Mobile communications transceiver and the apparatus of claim 13.

16. The apparatus of claim 13, wherein the one or more passive components include a layer over the second substrate.

17. An apparatus comprising:
a package having a chamber defined therein;
one or more microelectromechanical systems coupled with the package within the chamber; and
one or more passive components coupled with the package within the chamber.

18. The apparatus of claim 17, wherein the one or more microelectromechanical systems and the one or more passive components are each attached to a separate singulated die.

19. The apparatus of claim 18, further comprising a sealing material between the singulated dice, and around a periphery of the chamber.

20. The apparatus of claim 17, wherein the one or more passive components are fabricated on a wafer.

21. The apparatus of claim 17, wherein the one or more passive components are selected from the group consisting of capacitors and inductors.

22. The apparatus of claim 17, wherein the one or more passive components comprise one or more inductors.

23. An apparatus comprising:
an omnidirectional antenna;
a first substrate, a second substrate, and a chamber between the first substrate and the second substrate;
a seal between the first substrate and the second substrate and around a periphery of the chamber;
one or more microelectromechanical systems coupled with the first substrate within the chamber;
one or more passive components coupled with the second substrate within the chamber;
one or more interconnects within the chamber to couple the first substrate with the second substrate; and
one or more conductive paths that each have one end that is coupled with the interconnects and another end that is coupled with one or more electrical paths to the antenna.

24. The apparatus of claim 23, wherein the first substrate and the second substrate each comprise a singulated die.

25. The apparatus of claim 23, wherein the microelectromechanical systems comprise one or more selected from switches and film bulk acoustic resonators, and wherein the components comprise one or more selected from capacitors and inductors.

26. A method comprising:
aligning a first substrate having or more microelectromechanical systems coupled thereto and a second substrate having one or more passive components coupled thereto; and
coupling the aligned substrates, wherein coupling the aligned substrates comprises:
coupling the one or more microelectromechanical systems with the one or more passive components by forming a conductive path from a circuit of the first substrate to a circuit of the second substrate; and
sealing a chamber including the one or more microelectromechanical systems, the one or more passive components, and the conductive path, by forming a seal between the first substrate and the second substrate.

27. The method of claim 26, wherein forming the seal comprises bonding a ring of sealing material of the first substrate to a corresponding ring of sealing material of the second substrate.

28. The method of claim 27, wherein forming the conductive path comprises bonding a conductive interconnect material of the first substrate to a corresponding conductive interconnect material of the second substrate.

29. The method of claim 26, wherein the one or more passive components are selected from the group consisting of capacitors and inductors.

30. A method comprising:
aligning a first substrate having one or more microelectromechanical systems coupled thereto and a second substrate having one or more passive components coupled thereto;
coupling the aligned substrates, wherein aligning the substrates and the second substrate comprise aligning wafers, and wherein coupling the aligned substrates comprises coupling the aligned wafer; and
singulating the coupled wafers.

31. The method of claim 30, further comprising, prior to singulating the coupled wafers, removing portions of one wafer to provide access to external interconnect structures on the other wafer.

32. The method of claim 31, wherein removing the portions of the wafer comprises removing an entire thickness of the wafer, along perimeters of dice, by sawing with a saw blade that has a width that is greater than a width of a saw blade that is used for singulation.

33. The method of claim 31, wherein removing the portions of the wafer comprises:
prior to said aligning, removing less than an entire thickness of the wafer starting from an active surface of the wafer, along perimeters of dice, by sawing with a saw blade that has a width that is greater than a width of a saw blade that is used for singulation; and
after said coupling the first substrate with the second substrate, removing a remaining thickness of the wafer where said less than the entire thickness of the wafer was removed by one selected from sawing and backgrinding.

* * * * *